(12) United States Patent
Berkram et al.

(10) Patent No.: US 6,963,236 B2
(45) Date of Patent: Nov. 8, 2005

(54) METHOD AND APPARATUS FOR GENERATING AND CONTROLLING A QUADRATURE CLOCK

(75) Inventors: Daniel A. Berkram, Fort Collins, CO (US); Perry M. Wyatt, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/733,791

(22) Filed: Dec. 10, 2003

(65) Prior Publication Data

US 2005/0127974 A1 Jun. 16, 2005

(51) Int. Cl.[7] .......................... H03H 11/16; H03K 3/00
(52) U.S. Cl. ..................................... 327/238; 327/254
(58) Field of Search ................................. 327/231, 233, 327/236, 237, 238, 244, 245, 246, 247, 254, 255; 455/258

(56) References Cited

U.S. PATENT DOCUMENTS

| | | | | |
|---|---|---|---|---|
| 6,282,413 B1 | * | 8/2001 | Baltus | 455/260 |
| 6,337,976 B1 | * | 1/2002 | Kudou | 455/258 |
| 6,466,086 B2 | * | 10/2002 | Syoji | 329/308 |
| 6,545,546 B2 | * | 4/2003 | Takeshita et al. | 331/11 |

* cited by examiner

Primary Examiner—Tuan T. Lam (57) ABSTRACT

Quadrature clock generating apparatus includes a multiplexer selecting one of a generated clock and a gated generated clock as a double clock in accordance with a halt multiplexer control. Divider circuitry provides an alignment signal corresponding to an inverted double clock divided by two. A recovery circuit recovers first and second clocks having a 90° phase difference from the double clock in accordance with the alignment signal. A halt circuit controls the halt multiplexer control to select the gated generated clock when the alignment signal matches a pre-determined clock level. The halt multiplexer control is clocked by the generated clock.

20 Claims, 8 Drawing Sheets

METHOD AND APPARATUS FOR GENERATING AND CONTROLLING A QUADRATURE CLOCK

BACKGROUND

Digital logic circuits frequently rely on clock signals for synchronization, derivation of reference signals, measuring phase differences, and other functions. Some applications require a quadrature clock that has a 90° phase difference from a reference clock. A quadrature clock is frequently used for strobe signals, for example.

A centralized quadrature clock may be generated and distributed to all components. In particular, a first clock and a second clock having a 90° phase difference from the first clock are centrally generated and distributed. One disadvantage of this approach is that clock signals tend to have constraints that are difficult to maintain throughout the distribution when the distribution is over a relatively large area or used to drive a relatively large number of components. For example, significant consumption of die area and wire routing resources are required to meet skew requirements for both clocks in integrated circuit applications. The use of some types of integrated circuit logic in the clock distribution buffers may even result in a doubling of the power consumption due to the distribution of two clocks.

Another technique for generating the quadrature clock entails distributing a reference clock signal to regions of an integrated circuit. Each region has a local phase locked loop (PLL) or local delay locked loop (DLL) to derive the quadrature clock signal from the reference clock signal. A disadvantage of this approach is that the localized PLLs or DLLs introduce complexity into the integrated circuit design thus incurring more design and verification time. In addition, coordinating selection from the reference clock of the proper phase associated with the first and second clocks across all regions such that the first clock in one region is in phase with the first clock of another region is problematic.

SUMMARY

In view of limitations of known systems and methods, various methods and apparatus for generating and controlling a quadrature clock are described.

In one embodiment, a quadrature clock generating apparatus includes a multiplexer selecting one of a generated clock and a gated generated clock as a double clock in accordance with a halt multiplexer control. Divider circuitry provides an alignment signal corresponding to an inverted double clock divided by two. A recovery circuit recovers first and second clocks having a 90° phase difference from the double clock in accordance with the alignment signal. A halt circuit controls the halt multiplexer control to select the gated generated clock when the alignment signal matches a pre-determined clock level. The halt multiplexer control is clocked by the generated clock.

One embodiment of a method of generating a quadrature clock includes selecting one of a generated clock and a gated generated clock as a double clock in accordance with a halt multiplexer control, wherein the double clock has a frequency twice that of a received reference clock. An alignment signal corresponding to an inverted double clock divided by two is generated. A plurality of instances of a first clock and an associated second clock are derived from the double clock in accordance with the alignment signal. Each first and associated second clock instance have a 90° relative phase difference. The halt multiplexer control is controlled to select the gated generated clock when the alignment signal matches a pre-determined clock level, wherein the halt multiplexer is clocked by the generated clock.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
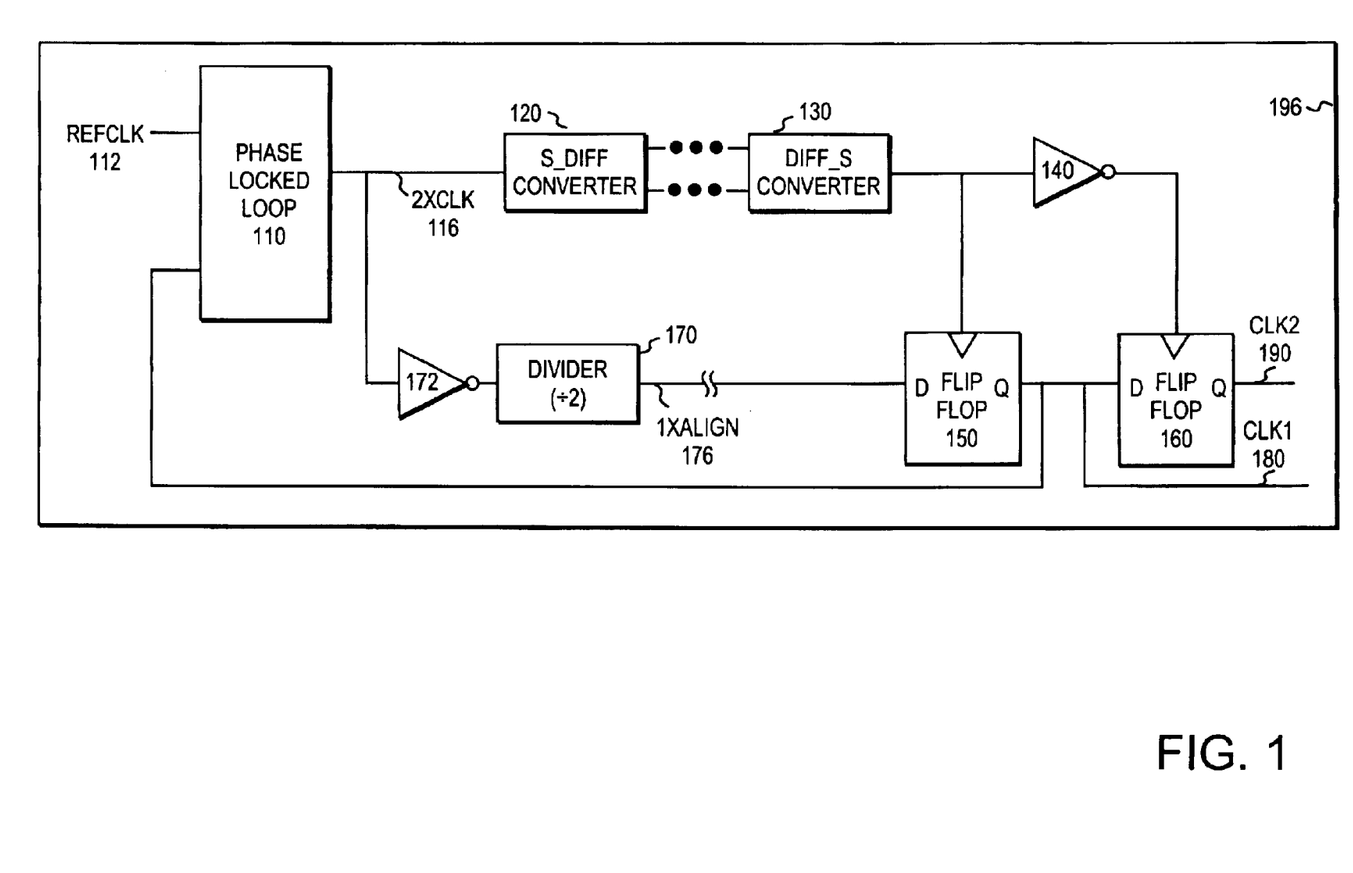
FIG. 1 illustrates one embodiment of quadrature clock generation circuitry.

FIG. 1 illustrates one embodiment of quadrature clock generation circuitry for generating a first clock CLK1 180 and a second clock CLK2 190. The second clock has a quadrature relationship to the first clock. In one embodiment, the clock generation circuitry resides on an integrated circuit die 196.

Clock generator 110 generates an output 116 having a frequency that is a multiple, m, of the frequency of a reference clock, REFCLK 112. In the illustrated embodiment, clock generator 110 is a phase locked loop (PLL). The PLL has a feedback path including inverter 172, divider 170, and flip-flop 150.

As a result of the divide-by-m divider, the frequency of the PLL output 116 is m times the frequency of REFCLK 112. The output of divider 170 has a frequency that is 1/m that of the PLL output.

In the illustrated embodiment, m=2 such that the PLL output is twice the frequency of REFCLK. PLL 110 is thus a clock generator that provides a double clock (2×CLK 116) that has a frequency twice that of the received reference clock, REFCLK.

In one embodiment, this 2×CLK 116 is distributed to the flip-flops 150, 160 in a differential form. Thus single-sided-to-differential converter 120 converts the single sided 2×CLK to a differential 2×CLK signal. Proximate the flip-flops, the differential-to-single-sided converter 130 converts the differential 2×CLK back to a single-sided 2×CLK.

Divider 170 and inverter 172 form divider circuitry for providing an alignment signal 1×ALIGN 176 having a frequency that is 1/m that of the PLL output. In particular, the divider circuitry provides a 1×ALIGN corresponding to an inverted PLL output divided by m. Given that the PLL output has a frequency that is m times the REFCLK frequency, the signal 1×ALIGN 176 has a frequency that is the same as that of the REFCLK. Regardless of the value of m, the 1×ALIGN will always have a frequency that is the same as that of the REFCLK.

In the illustrated embodiment, m=2 such that 1×ALIGN corresponds to an inverted double clock divided by two. In the illustrated embodiment, the inverter 172 inverts the double clock such that the divider 170 receives an inverted double clock.

The 1×ALIGN 176 is provided as a data input to flip-flop 150. The output of flip-flop 150 is the first clock CLK1 180. CLK1 is provided as a feedback input to PLL 110.

The double clock (i.e., 2×CLK) is used to clock flip-flop 150. The double clock is inverted by inverter 140 and the inverted double clock (i.e., $\overline{2\times CLK}$) is used to clock flip-flop 160. Flip-flop 150 provides the first clock signal, CLK1 180. Flip-flop 160 provides the second clock signal, CLK2 190. The second clock has a 90° phase displacement from the first clock. In one embodiment, each of flip-flops 150, 160 is a D-type flip-flop.

PLL 110 drives the PLL output so as to minimize the phase difference between REFCLK and CLK1. Thus even if CLK1 and REFCLK are initially out of phase, PLL 110 will drive the PLL output to bring CLK1 and REFCLK into phase alignment.

In one embodiment, the clock generator, divider circuitry and recovery circuitry reside on a same integrated circuit die. In one embodiment, the clock generator, divider circuitry and recovery circuitry are formed as a metal oxide semiconductor field effect transistor (MOSFET) integrated circuit.

Figure 2:
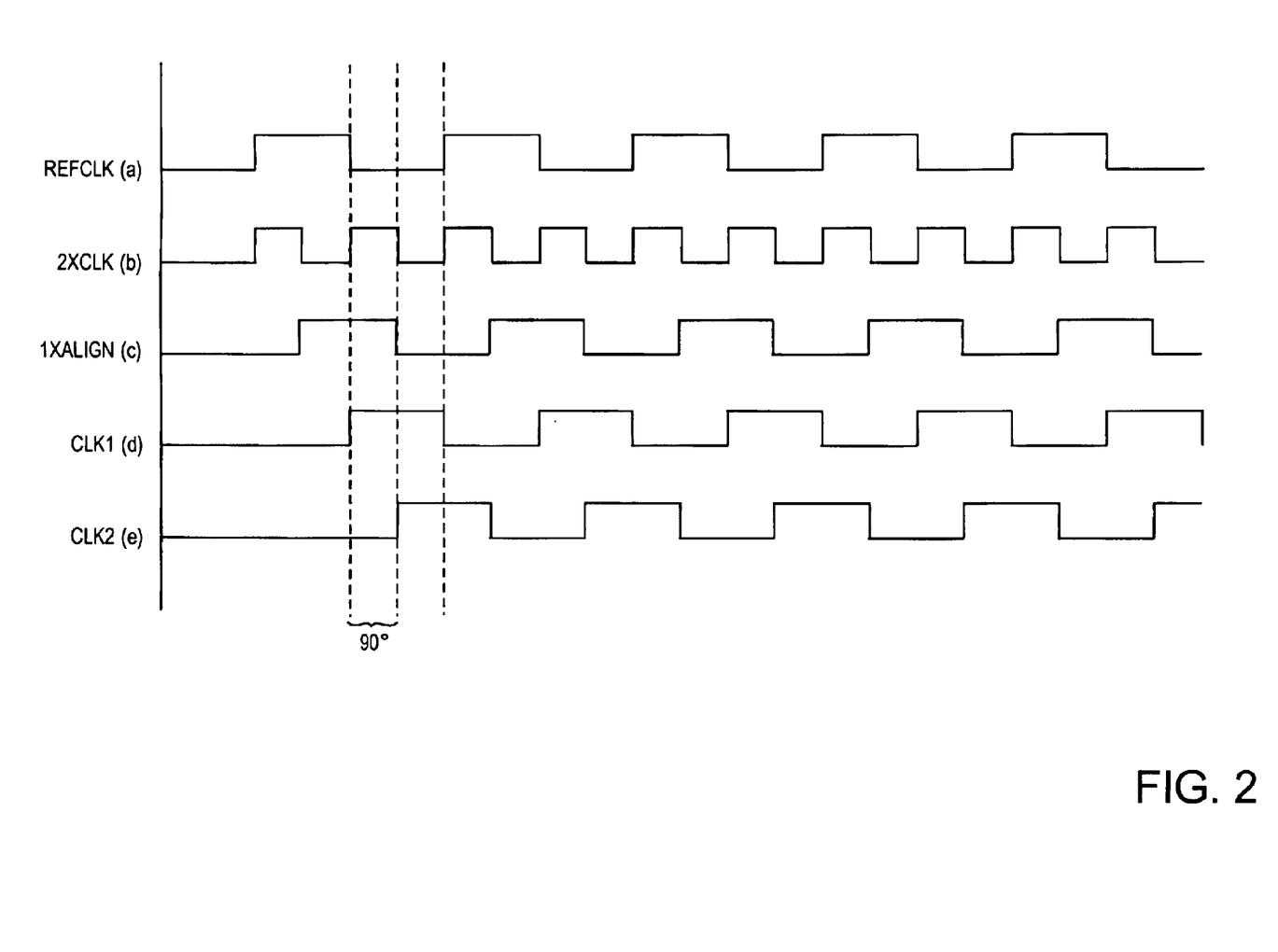
FIG. 2 illustrates one embodiment of waveforms associated with the clock generation circuitry of FIG. 1.

FIG. 2 illustrates waveforms for various signals present in the quadrature clock generation circuitry of FIG. 1. The 2×CLK waveform (b) has twice the frequency of REFCLK illustrated as waveform (a). The 1×ALIGN waveform (c) has half the frequency as the double clock 2×CLK waveform. Accordingly, 1×ALIGN and REFCLK have the same frequency. As a result of the inverted 2×CLK presented to the divider, the leading edge of the 1×ALIGN signal is aligned with a falling edge of the 2×CLK signal.

Given that the CLK1 signal of waveform (d) is derived by clocking a flip-flop receiving the 1×ALIGN signal, the CLK1 signal of waveform (d) will transition to the value of 1×ALIGN on the rising edge of the 2×CLK.

The CLK2 signal will transition to the value of CLK1 on the rising edge of $\overline{2\times CLK}$. Accordingly the CLK2 signal of waveform (e) transitions to the value of CLK1 on the falling edge of the 2×CLK. As indicated CLK2 has a 90° phase displacement from CLK1.

The synchronization between waveforms (b)–(e) is maintained even when the PLL has not locked. Although a 180° phase difference is illustrated with respect to REFCLK and CLK1, the PLL will adjust to bring REFCLK and CLK1 into phase alignment and the PLL will "lock" to maintain the alignment between CLK1 and REFCLK. Accordingly, the phase difference illustrated between CLK1 and REFCLK is only an initial condition. The synchronization between waveforms (a) and the remaining waveforms (b)–(e) will vary until the PLL locks at which point waveform (d) will be synchronized and in phase with waveform (a).

Figure 3:
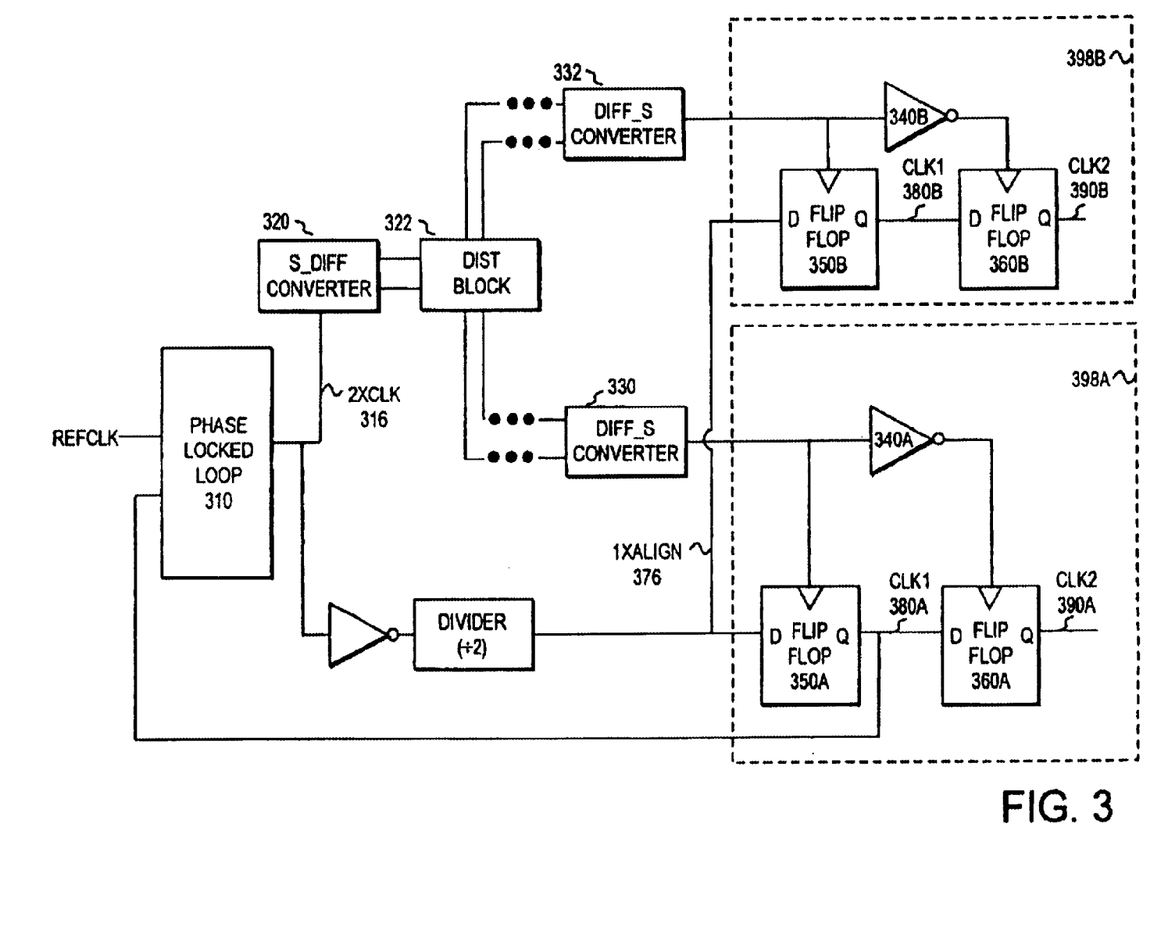
FIG. 3 illustrates one embodiment of quadrature clock generation circuitry providing a multiple instances of a quadrature dock.

FIG. 3 illustrates one embodiment of creating multiple instances of the quadrature clock. The quadrature clock distribution of FIG. 3 incorporates the benefits of both central generation and distributed generation through the use of multiple PLL/DLLs without the aforementioned disadvantages of either architecture.

The power requirements associated with central generation of the quadrature are avoided by using localized flip-flops to distribute the derived quadrature clock to a local region. Although the 1×ALIGN signal is distributed to all local regions, the 1×ALIGN signal is used for alignment only and is not used to drive either CLK1 or CLK2. The 2×CLK signal need only clock a few components within each local region rather than all clocked components throughout the integrated circuit.

Unlike the distributed PLL/DLL architecture, a single alignment signal enables selection of the proper edges of the 2×CLK signal associated with each of the CLK1 and CLK2 signals. Moreover, considerable skewing or drifting of 1×ALIGN is tolerable because the 1×ALIGN is used to identify which edges of the 2×CLK signal to select.

Given that CLK2 is derived from CLK1 rather than independently derived from the 1×ALIGN, the 1×ALIGN signal can shift almost 90° in either direction while associating the same edges of the 2×CLK with CLK1 or CLK2. Thus distribution of the 1×ALIGN is substantially immune from ordinary clock skew considerations.

The 1×ALIGN 376 is distributed to each local region associated with a recovery circuit. The double clock 316 (2×CLK) is similarly distributed to each local region. In the illustrated embodiment, the double clock is distributed as a differential double clock that is converted back to a single ended double clock at each local region. In particular, single-sided-to-differential converter 320 converts the single sided 2×CLK to a differential 2×CLK signal that is provided to distribution block 322. Proximate the flip-flops, the differential-to-single-sided converter 330, 332 associated with the local region converts the differential 2×CLK back to a single-sided 2×CLK.

Each local region includes a recovery circuitry 398B for recovering CLK1 and CLK2 from the distributed 2×CLK and 1×ALIGN signals. In the illustrated embodiment, recovery circuit 398B includes flip-flops 350B, 360B, and inverter 340B for recovering or reproducing the CLK1 380B and CLK2 390B clocks. In one embodiment, an integrated circuit has a plurality of local regions requiring local generation of the quadrature clock from the distributed double clock and alignment signals.

CLK1 380A and CLK1 380B are distinctly generated instances of the same clock signal, CLK1. Similarly, CLK2 390A and CLK2 390B are distinctly generated instances of the same clock signal, CLK2. Thus CLK1 380A=CLK1 380B even though they are independently derived from the 2×CLK and 1×ALIGN signals. Similarly, CLK2 390A-CLK2 390B even though they are independently derived from the 2×CLK and 1×ALIGN signals. PLL 310 only requires one instance of the first clock for feedback. Thus only one of CLK1 380A . . . 380B is provided to PLL 310 for feedback.

Figure 4:
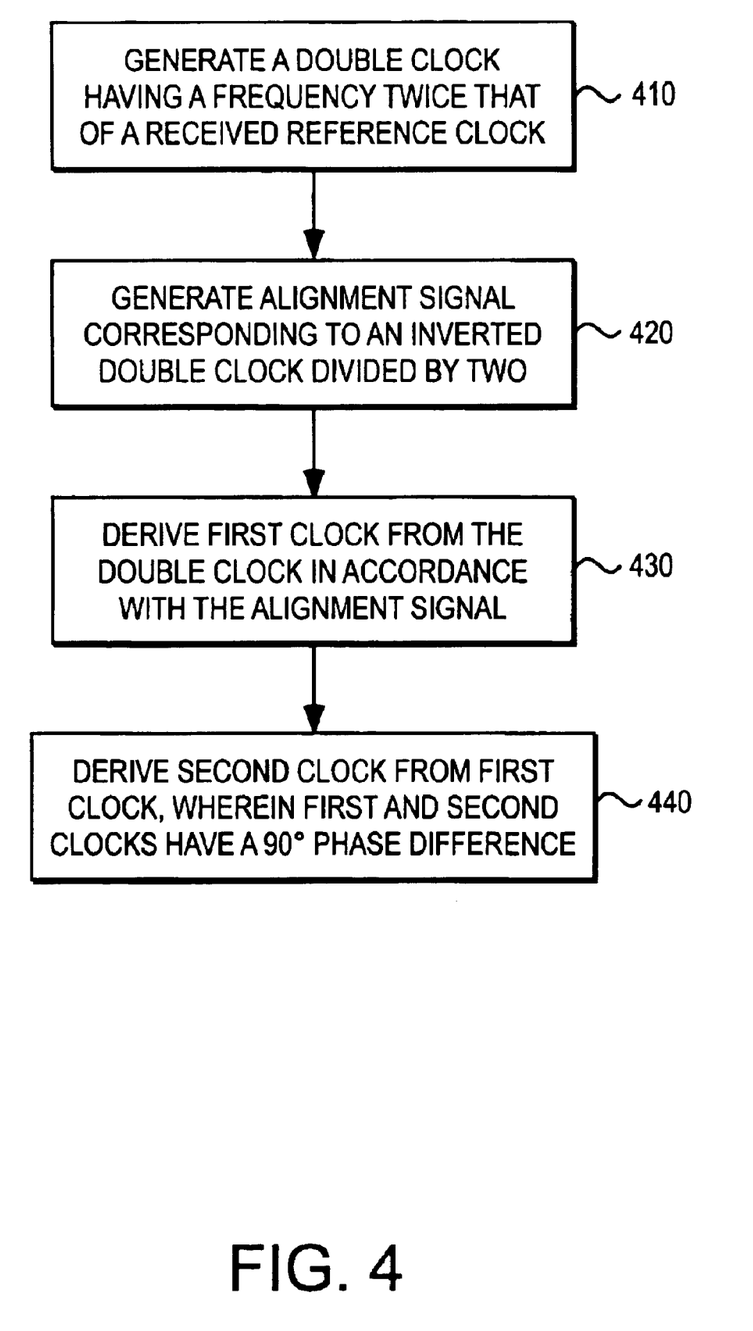
FIG. 4 illustrates one embodiment of a method for generating a quadrature clock.

FIG. 4 illustrates one embodiment of a method for generating a quadrature clock. In step 410, a double clock having a frequency twice that of a received reference clock is generated. An alignment signal corresponding to an inverted double clock divided by two is generated in step 420. A first clock is derived from the double clock in accordance with the alignment signal in step 430. The alignment signal identifies which edges of the double clock are associated with the first clock. The second clock is also derived from the alignment signal. In FIGS. 1, 3 the first clock is latched to provide the second clock in accordance with the inverted double clock. Thus in step 440, the second clock is derived from the first clock. The first and second clocks have substantially a 90° phase difference.

The ability to halt and step the quadrature clock is useful for testing the integrated circuit incorporating the quadrature clock of FIGS. 1 and 3. The ability to stop the quadrature clock at a particular level and subsequently step the quadrature clock requires additional circuitry.

Figure 5:
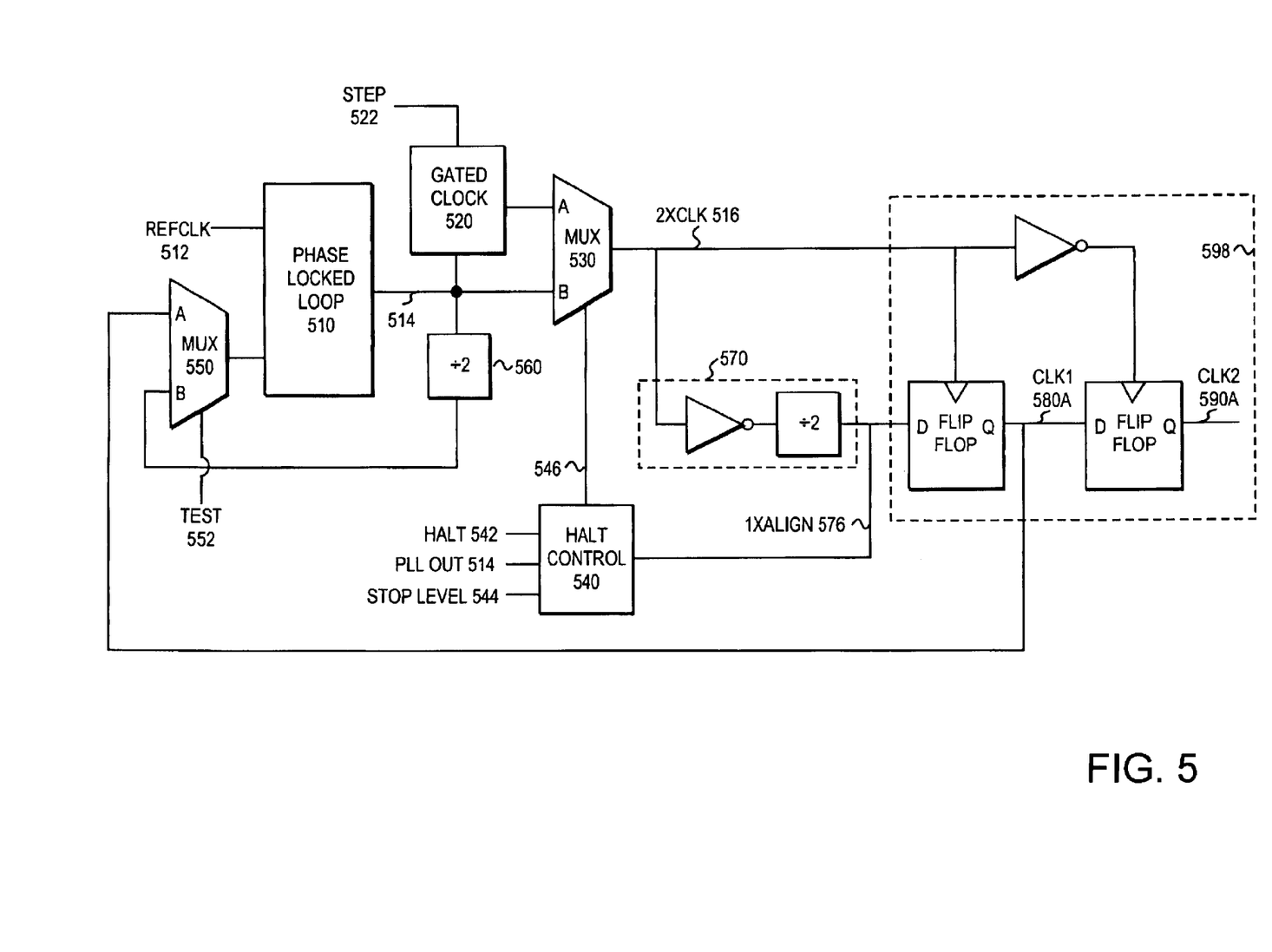
FIG. 5 illustrates one embodiment of an apparatus for generating and controlling the quadrature clock.

FIG. 5 illustrates one embodiment of a quadrature clock generator including circuitry for halting and stepping the quadrature clock. Controlling the quadrature clock in such a fashion may be provided in a test mode of operation in contrast with a normal mode of operation. PLL 510 cannot simply be stopped and re-started in a locked condition. Logic 530, 560, and 550 effectively serve as a "clutch" mechanism to couple or de-couple the divider and recovery circuits between the PLL 510 and a gated clock 520 when halting and stepping the quadrature clock from a particular level or phase is desired in a test mode.

Halt control 540 generates the halt multiplexer control 546 used to control selection of the double clock and selection of the PLL feedback path. Multiplexer 530 selects the double clock 516 (2×CLK) as either the PLL output 514 or the gated clock 520 in accordance with the halt multiplexer control 546. The gated clock 520 gates the PLL output 514 in accordance with a step signal 522.

When multiplexer 530 selects the gated clock 520 to provide the double clock 516, the CLK1 580 signal is unsuitable as a feedback signal to the PLL 510 given that PLL 510 is no longer directly driving the double clock that CLK1 is derived from. Accordingly, multiplexer 550 and divider 560 provide a feedback clock signal having a frequency half that of the PLL output 514 in lieu of CLK1 580 to the PLL. This alternate feedback path may be referred to as the bypass feedback path or test feedback path.

The gated clock 520 ensures that any changes in double clock are synchronized with the PLL output 514 in the test mode. The halt control 546 ensures that transitions between the halt and "free-running" conditions during a test mode are synchronized with transitions in the PLL output state 514.

FIG. 5 thus illustrates a clock generator providing a clock output 514 having a frequency that is twice that of a received reference clock 512. A multiplexer 530 is coupled to select one of the clock output 514 and a gated clock 520 output as a double clock 516 in accordance with a halt multiplexer control 546. Divider circuitry 570 divides the double clock to provide an alignment signal 576 with a frequency half that of the double clock. A recovery circuit 598 recovers a first clock 580A and a second clock 590A from the double clock 516 in accordance with the alignment signal 576, wherein the first and second clocks have substantially a 90° phase difference.

The halt control should be disabled during normal operation. This is accomplished in one embodiment by tying HALT 542 to a logic level that ensures halt multiplexer control 546 always selects PLL output 514 during normal operational modes. Stop level 544 indicates the logic level at which the halt should occur as furthe described with respect to FIG. 6.

Multiplexer 550 provides a selected one of a normal feedback path or a test feedback path to PLL 510 in accordance with the signal, TEST 552. During normal operation, the normal feedback path with CLK1 580 is selected as the feedback clock signal for the PLL. When testing, however, CLK1 580 is not being directly driven by the PLL and is not a suitable feedback signal. Accordingly, a divided PLL output (due to divider 560) is selected as the feedback clock signal from a test feedback path when testing. TEST 552 is tied to a logic level that ensures multiplexer 550 selects CLK1 580 as the feedback clock for PLL 510 during the normal operational modes. TEST 552 provides the test feedback path to PLL during test modes.

Figure 6:
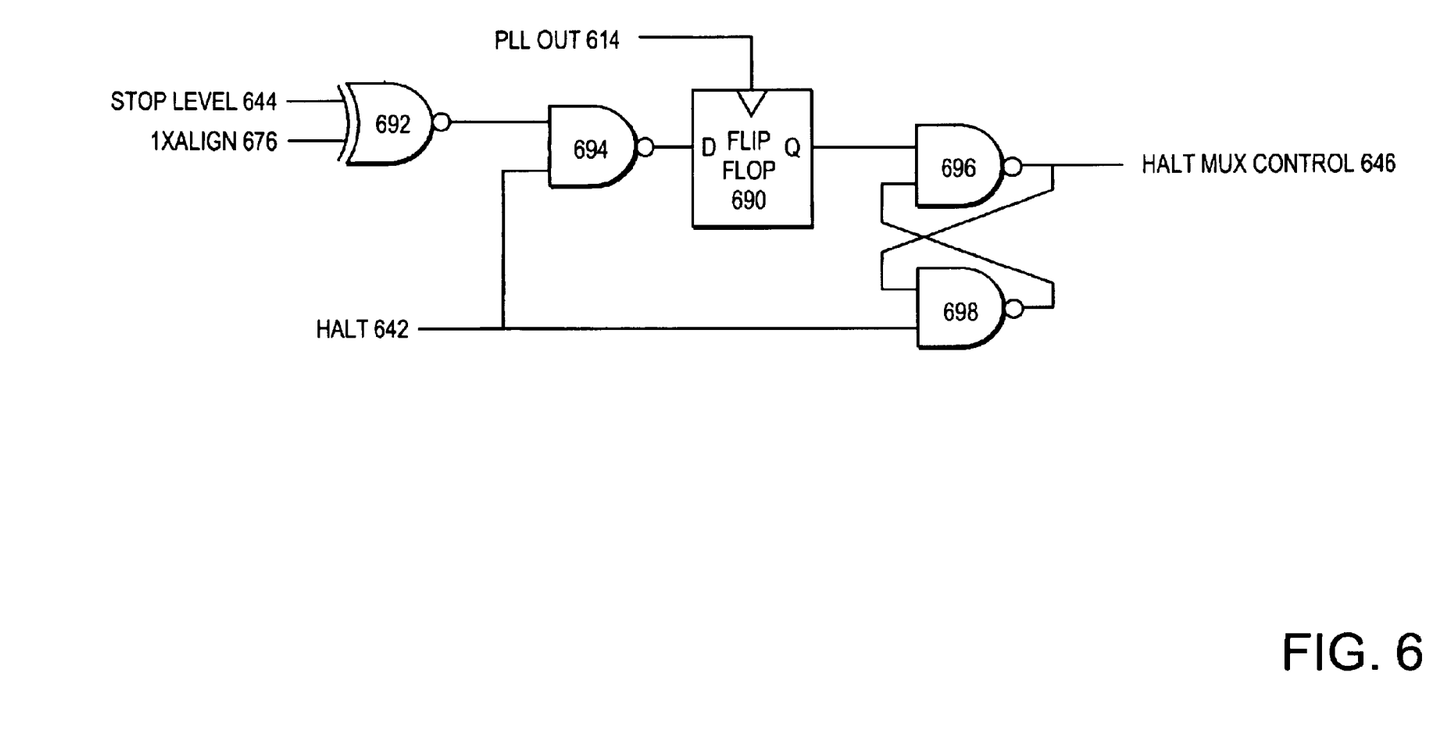
FIG. 6 illustrates one embodiment of a halt control circuit for controllably halting and stepping the quadrature clock.

FIG. 6 illustrates one embodiment of the halt control 540 of FIG. 5. The halt control circuitry generates halt multiplexer control 646 from inputs stop level 644, 1×ALIGN 676, halt 642, and PLL out 614.

The 1×ALIGN 676 and STOP LEVEL 644 are provided as inputs to exclusive NOR gate 692. STOP LEVEL 644 indicates whether CLK1 should be stopped at either a high or a low level. NAND gate 694 receives a halt signal 642 and the output of exclusive NOR gate 692. The output of exclusive NOR gate 692 is provided as the data input to flip-flop 690. In one embodiment flip-flop 690 is a D-type flip-flop.

Cross-coupled NAND gates 696 and 698 form a latch providing the halt multiplexer control 646. Tying HALT 642 to a low logic level ensures that the halt multiplexer control is also a low logic level. Referring to FIG. 5, the halt control circuit 540 should be disabled during normal operation of the quadrature clock generator when the PLL output 514 is the double clock. Multiplexer 530 selects the gated clock 520 when A=halt multiplexer control 546 or the PLL output when B=halt multiplexer control. For the halt control circuit of FIG. 6, this implies that B=0 and A=1 because the halt multiplexer control is 0 when disabled.

When HALT is enabled, the halt multiplexer control selects the gated clock as the double clock when the 1×ALIGN 676 and STOP LEVEL 644 match. STOP LEVEL indicates which clock level to stop at (i.e., low, high). Note the use of 1×ALIGN rather than the CLK1 signal in the combinatorial logic of FIG. 6. Due to the high frequency of the 2×CLK and the electrical length of the path to the multiple instances of the recovery circuits, the 1×ALIGN rather than the CLK1 signal should be used.

Figure 7:
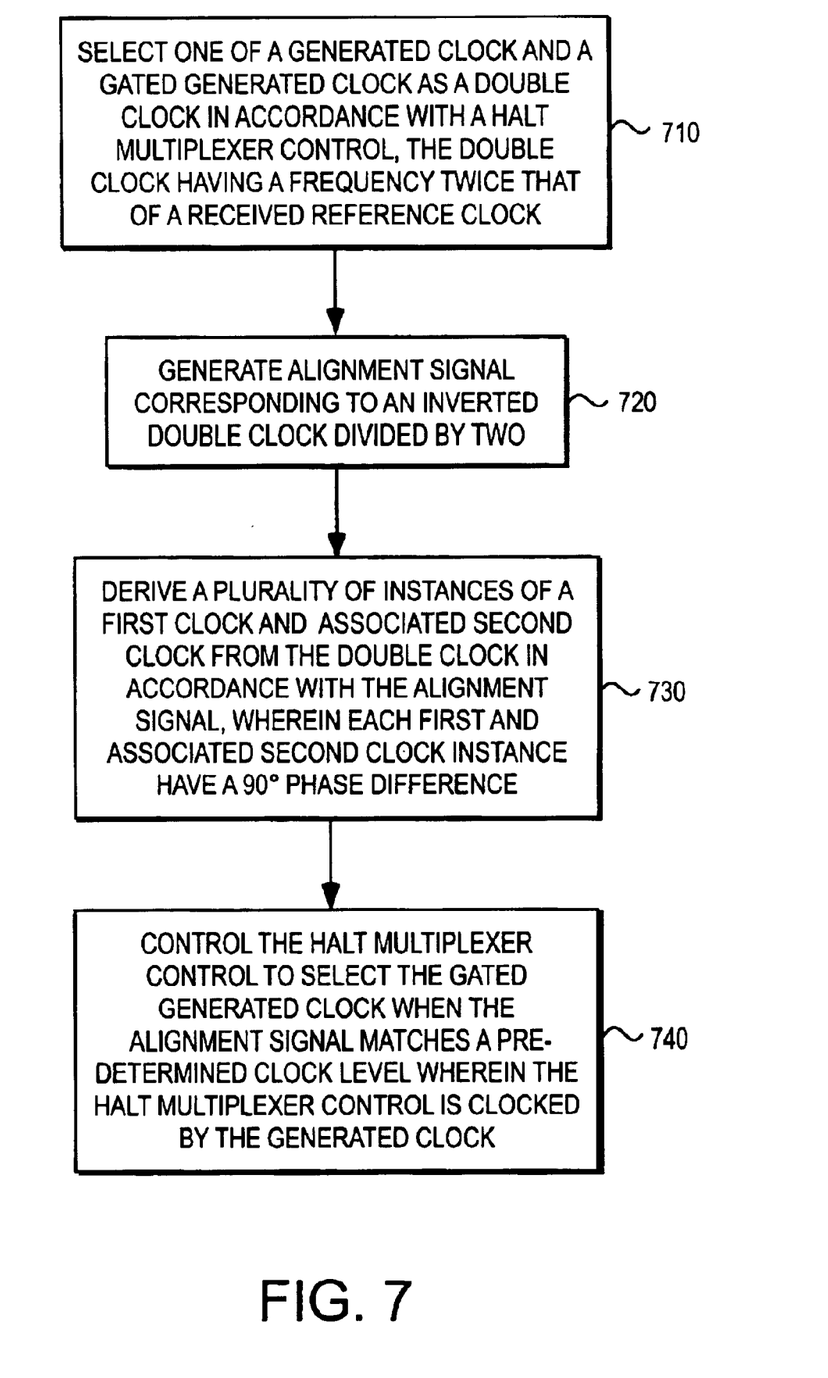
FIG. 7 illustrates one embodiment of a method for generating and controlling the quadrature clock.

FIG. 7 illustrates one embodiment of a method of generating and controlling the quadrature clock. In step 710, one of a generated clock (e.g., PLL out 514) and a gated generated clock (e.g., gated clock 520) is selected as a double clock in accordance with a halt multiplexer control. The double clock has a frequency twice that of a received reference clock.

An alignment signal corresponding to an inverted double clock divided by two is generated in step 720. A plurality of instances of a first clock and associated second dock are derived from the double dock in accordance with the alignment signal in step 730. Each first and associated second clock instance have a relative 90° phase difference.

In step 740, the halt multiplexer control is controlled to select the gated generated clock signal when the alignment signal matches a pre-determined clock level. The halt multiplexer control is clocked by the generated clock for synchronization with the generated clock.

The halt multiplexer control thus permits the user to stop all instances of the quadrature clock at a particular level in synchronization with the generated clock. Once the gated generated clock is selected, the user may step the quadrature clock instances through the quadrature clock cycles such that the quadrature clock instances are synchronized with each other.

Figure 8:
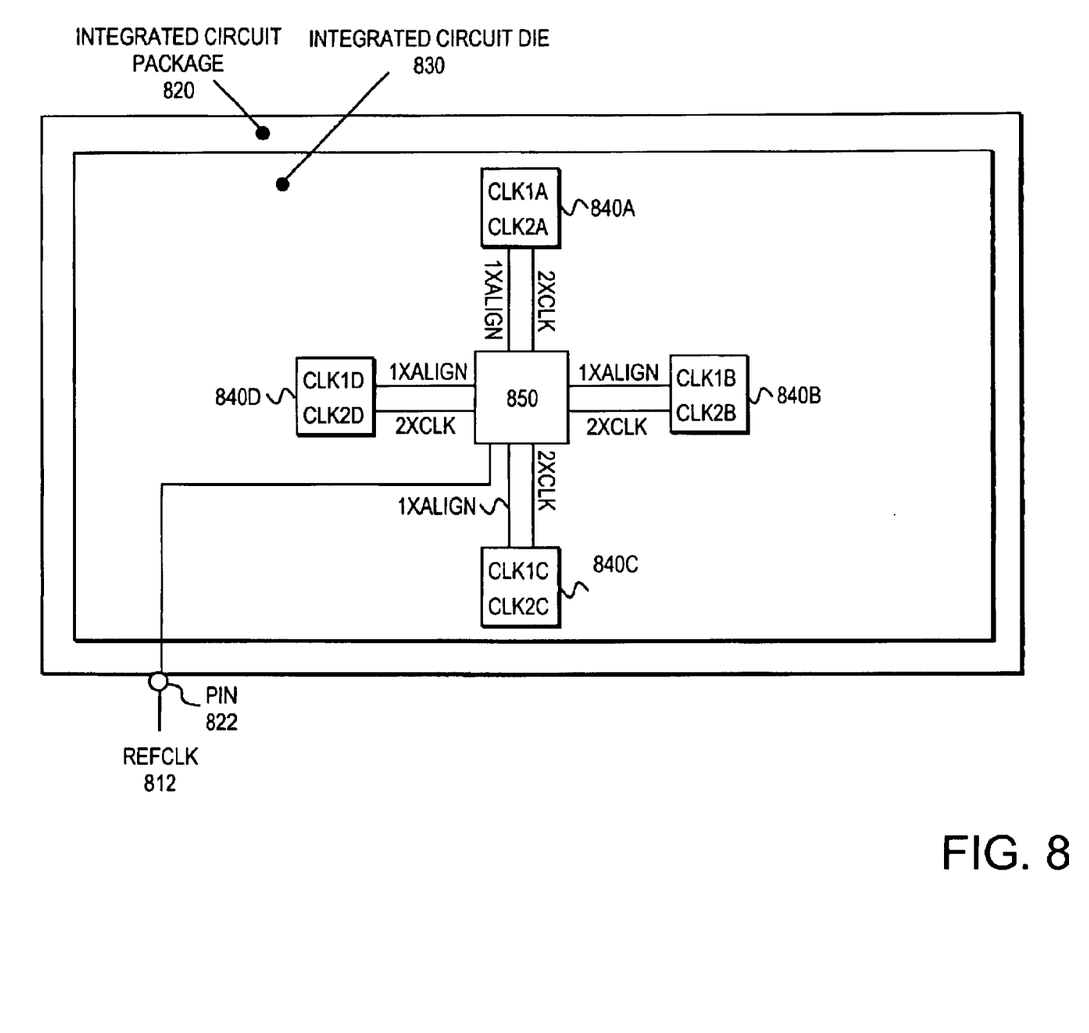
FIG. 8 illustrates one embodiment of quadrature clock generation and distribution across an integrated circuit die within an integrated circuit package.

FIG. 8 illustrates one embodiment of quadrature clock generation and distribution across an integrated circuit die. A clock generator is fabricated on a given area 850 of an integrated circuit die 830. The 1×ALIGN and the double clock (2×CLK) are distributed to each of a plurality of local regions 840A, 840B, 840C, . . . 840D. Each local region has a recovery circuit for deriving a local instance of CLK1 and CLK2 from the 2×CLK and 1×ALIGN signals.

The CLK1 instances are relatively phase aligned such that CLK1A=CLK1B=CLK1C . . . =CLK1D). Similarly, the CLK2 instances are relatively phase aligned such that CLK2A=CLK2B=CLK2C . . . =CLK2C). Each CLK2 instance has a 90° phase difference from its associated CLK1 instance (as well as the other instances of CLK1).

The integrated circuit die 830 resides within an integrated circuit package 820. A REFCLK 812 is provided to the clock generator 830 via an external pin 822 of the integrated circuit package 820.

Various modifications and changes may be made thereto without departing from the broader spirit and scope of the invention as set forth in the claims. The specification and drawings are, accordingly, to be regarded in an illustrative rather than a restrictive sense.

What is claimed is:

1. A quadrature clock generating apparatus comprising:
    a multiplexer selecting one of a generated clock and a gated generated clock as a double clock in accordance with a halt multiplexer control, wherein the double clock has a frequency twice that of a reference clock;

divider circuitry coupled to provide an alignment signal corresponding to an inverted double clock divided by two;

a recovery circuit for recovering a first clock and a second clock from the double clock in accordance with the alignment signal, wherein the first and second clocks have substantially a 90° phase difference; and a halt circuit controlling the halt multiplexer control to select the gated generated clock when the alignment signal matches a pre-determined clock level, wherein the halt multiplexer control is clocked by the generated clock.

2. The apparatus of claim 1 wherein the recovery circuit comprises:

a first flip-flop receiving the alignment signal, wherein the first flip-flop is clocked by the double clock to provide the first clock; and a second flip-flop receiving the first clock, wherein the second flip-flop is clocked by an inverted double clock to provide the second clock.

3. The apparatus of claim 2 wherein each of the first and second flip-flops is a D-type flip-flop.

4. The apparatus of claim 1 further comprising a phase locked loop to provide the generated clock.

5. The apparatus of claim 1 wherein the divider circuitry further comprises:

an inverter coupled to provide an inverted double clock; and a divider coupled to divide the inverted double clock to provide the alignment signal.

6. The apparatus of claim 1 further comprising a clock generator for providing the generated clock, wherein the clock generator, divider circuitry, and recovery circuitry reside on a same integrated circuit die.

7. The apparatus of claim 6 wherein the clock generator, divider circuitry and recovery circuitry are formed as a metal oxide semiconductor field effect transistor (MOSFET) integrated circuit.

8. A quadrature clock generation apparatus, comprising:

a multiplexer selecting one of a generated clock and a gated generated clock as a double clock in accordance with a halt multiplexer control, wherein the double clock has a frequency twice that of a reference clock;

divider circuitry coupled to provide an alignment signal corresponding to an inverted double clock divided by two;

a plurality of recovery circuits, each recovery circuit deriving an instance of a first clock and an instance of a second clock from the double clock in accordance with the alignment signal, wherein the first and second clocks associated with each recovery circuit have substantially a 90° phase difference; and a halt circuit controlling the halt multiplexer control to select the gated generated clock when the alignment signal matches a pre-determined clock level, wherein the halt multiplexer control is clocked by the generated clock.

9. The apparatus of claim 8 wherein the first dock associated with any recovery circuit is substantially synchronized with the first clock associated with any other recovery circuit.

10. The apparatus of claim 8 wherein each recovery circuit comprises:

a first flip-flop receiving the alignment signal, wherein the first flip-flop is clocked by the double clock to provide the first clock; and a second flip-flop receiving the first clock, wherein the second flip-flop is clocked by an inverted double clock to provide the second clock.

11. The apparatus of claim 10 wherein each of the first and second flip-flops is a D-type flip-flop.

12. The apparatus of claim 8 further comprising a phase locked loop to provide the generated clock, wherein each instance of the first and second clocks has a same frequency as the reference clock, wherein each instance of the first clock is synchronized with the reference clock.

13. The apparatus of claim 8 wherein the divider circuitry further comprises:

an inverter coupled to provide an inverted double clock from the double clock; and a divider coupled to divide the inverted double clock to provide the alignment signal.

14. The apparatus of claim 8 further comprising a clock generator for providing the generated clock, wherein the clock generator, divider circuitry, and recovery circuitry reside on a same integrated circuit die.

15. The apparatus of claim 14 wherein the clock generator, divider circuitry and recovery circuitry are formed as a metal oxide semiconductor field effect transistor (MOSFET) integrated circuit.

16. A method of generating a quadrature clock, comprising:

selecting one of a generated clock and a gated generated clock as a double clock in accordance with a halt multiplexer control, wherein the double clock has a frequency twice that of a received reference clock;

generating an alignment signal corresponding to an inverted double clock divided by two;

deriving a plurality of instances of a first clock and an associated second clock from the double clock in accordance with the alignment signal, wherein each first and associated second clock instance have a 90° relative phase difference; and controlling the halt multiplexer control to select the gated generated clock when the alignment signal matches a pre-determined clock level, wherein the halt multiplexer control is clocked by the generated clock.

17. The method of claim 16 wherein deriving each instance of the first clock includes latching the alignment signal in accordance with the double clock to provide the first clock, wherein deriving the each instance of the second clock includes latching the associated first clock in accordance with an inverted double clock to provide the second clock.

18. The method of claim 16 further comprising:

providing differential distribution of the double clock.

19. The method of claim 16 further comprising:

stepping the gated generated clock to step the first and second clock instances through the quadrature clock cycles.

20. The method of claim 16 wherein deriving each instance of the first clock further comprises providing the alignment signal to a first latch, wherein the first latch is clocked by the double clock to provide that instance of the first clock.

* * * * *

UNITED STATES PATENT AND TRADEMARK OFFICE
CERTIFICATE OF CORRECTION

PATENT NO. : 6,963,236 B2  Page 1 of 1
APPLICATION NO. : 10/733791
DATED : November 8, 2005
INVENTOR(S) : Daniel A. Berkram et al.

It is certified that error appears in the above-identified patent and that said Letters Patent is hereby corrected as shown below:

In column 2, line 33, delete "dock" and insert -- clock --, therefor.

In column 3, line 4, delete "dock" and insert -- clock --, therefor.

In column 4, line 38, delete "dock" and insert -- clock --, therefor.

In column 4, line 57, delete "dock" and insert -- clock --, therefor.

In column 4, line 61, after "quadrature" delete "dock" and insert -- clock --, therefor.

In column 4, line 61, after "the quadrature" delete "dock" and insert -- clock --, therefor.

In column 6, line 26, after "second" delete "dock" and insert -- clock --, therefor.

In column 6, line 27, delete "dock" and insert -- clock --, therefor.

In column 7, line 61, in Claim 9, delete "dock" and insert -- clock --, therefor.

Signed and Sealed this

Eleventh Day of August, 2009

David J. Kappos
*Director of the United States Patent and Trademark Office*